(12) United States Patent
Lin et al.

(10) Patent No.: US 6,473,282 B1
(45) Date of Patent: Oct. 29, 2002

(54) LATCH-UP PROTECTION CIRCUIT FOR INTEGRATED CIRCUITS BIASED WITH MULTIPLE POWER SUPPLIES AND ITS METHOD

(75) Inventors: Shi-Tron Lin, Taipei (TW); Ta-Lee Yu, Hsinchu Hsien (TW); Yung-Chow Peng, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/547,186

(22) Filed: Apr. 11, 2000

(30) Foreign Application Priority Data

Oct. 16, 1999 (TW) ........................................ 88117915 A

(51) Int. Cl.[7] .................................................. H02H 3/20
(52) U.S. Cl. .............................. 361/90; 361/86; 327/543
(58) Field of Search .............................. 361/18, 78, 86, 361/90, 91.1, 91.5, 111, 115, 56; 327/530, 538, 543, 544, 545; 257/372, 355, 356, 371, 392, 393

(56) References Cited

U.S. PATENT DOCUMENTS

| | | | | |
|---|---|---|---|---|
| 4,871,927 A | * | 10/1989 | Dallavalle | 307/296 |
| 5,708,549 A | * | 1/1998 | Croft | 361/56 |
| 5,742,465 A | * | 4/1998 | Yu | 361/111 |
| 5,942,932 A | * | 8/1999 | Shen | 327/535 |
| 6,008,688 A | * | 12/1999 | Faue | 327/534 |
| 6,014,053 A | * | 1/2000 | Womack | 327/538 |
| 6,157,070 A | * | 12/2000 | Lin et al. | 257/392 |
| 6,252,452 B1 | * | 5/2001 | Hatori et al. | 327/544 |

* cited by examiner

*Primary Examiner*—Ronald W. Leja
(74) *Attorney, Agent, or Firm*—Beyer Weaver & Thomas LLP

(57) ABSTRACT

A latch-up protection circuit for an integrated circuit powered through a first power rail and a second power rail is disclosed, the integrated circuit having at least one semiconductor bulk of a conductivity type. The latch-up protection circuit comprises a control circuit and a switch circuit. The control circuit is connected to the first power rail and the second power rail for detecting a relative voltage therebetween and generating a first control signal and a second control signal. The switch circuit connected to the first power rail and the control circuit. When the relative voltage is greater than a first predetermined value, the switch circuit in response to the first control signal electrically connects the first power rail with the at least one semiconductor bulk. When the relative voltage is smaller than the first predetermined value, the switch in response to the first control signal electrically disconnects the first power rail from the at least one semiconductor bulk.

23 Claims, 7 Drawing Sheets

LATCH-UP PROTECTION CIRCUIT FOR INTEGRATED CIRCUITS BIASED WITH MULTIPLE POWER SUPPLIES AND ITS METHOD

BACKGROUND OF THE INVENTION

1. Field of the Invention

The present invention generally relates to integrated circuit technologies. More particularly, the present invention relates to a latch-up protection circuit for integrated circuits biased with multiple power supplies and its method.

2. Description of the Related Art

Due to the different voltage requirements of different integrated circuit (IC) generations, an IC chip may be powered by multiple power supplies at different voltage levels. For example, the IC chip may have input/output circuitry powered by a voltage source of 5V while employing another voltage source of 3.3V to drive internal circuitry, such as memory cells and sense amplifiers.

As shown in FIG. 1, a conventional CMOS circuit of an a IC chip with multiple power supplies is schematically illustrated in a cross-sectional view. In the drawing, the CMOS circuitry, formed in a semiconductor substrate 5, includes high-voltage CMOS circuit block 1 and a low-voltage CMOS circuit block 2. For example, the CMOS circuitry is implemented by means of a twin-well process; therefore, an n-well 10 and a p-well 11 are provided within the extent of the high-voltage CMOS circuit block 1, while an n-well 20 and a p-well 21 are provided within the extent of the low-voltage CMOS circuit block 2. If the semiconductor substrate 5 is a p-type substrate, the p-wells 11 and 21 can be optionally omitted. If the semiconductor substrate 5 is an n-type substrate, the n-wells 10 and 20 can be optionally omitted.

The high-voltage CMOS circuit block 1 is composed of a pMOS transistor and an nMOS transistor. The pMOS transistor includes two spaced-apart $p^+$-type diffusion regions 12 and 13 as its source and drain, respectively, and a gate 14 overlying a portion of the n-type well 10 therebetween. The nMOS transistor includes two spaced-apart $n^+$-type diffusion regions 15 and 16 as its source and drain, respectively, and a gate 17 overlying a portion of the p-well 11 therebetween. In FIG. 1, the high-voltage CMOS circuit block 1 is powered by a higher voltage $V_{DDH}$. Therefore, the pMOS transistor is configured with the $p^+$-type source diffusion region 12 connected to a $V_{DDH}$ power rail, while the nMOS transistor is configured with the $n^+$-type source diffusion region 15 connected to a $V_{SS}$ power rail, the $V_{SS}$ power rail being connected to the ground potential GND, typically.

Also, the low-voltage CMOS circuit block 2 is composed of a pMOS transistor and an nMOS transistor. The pMOS transistor includes two spaced-apart $p^+$-type diffusion regions 22 and 23 as its source and drain, respectively, and a gate 24 overlying a portion of the n-type well 20 therebetween. The nMOS transistor includes two spaced-apart $n^+$-type diffusion regions 25 and 26 as its source and drain, respectively, and a gate 27 overlying a portion of the p-well 21 therebetween. In FIG. 1, the low-voltage CMOS circuit block 2 is powered by a lower voltage $V_{DDL}$. Therefore, the pMOS transistor is configured with the $p^+$-type source diffusion region 22 connected to a $V_{DDL}$ power rail, while the nMOS transistor is configured with the $n^+$-type source diffusion region 25 connected to the $V_{SS}$ power rail, the $V_{SS}$ power being connected to the ground potential GND, typically.

Typically, the n-type well 20 is biased via the $V_{DDH}$ power rail. As shown in FIG. 1, the n-type well 20 is electrically connected to the $V_{DDH}$ power rail by an $n^+$-type contact region 28 to ensure that the junction between the $p^+$-type source diffusion region 22 and the n-type well 20 keeps reverse-biased without causing leakage current. Moreover, the n-well 10 is electrically connected to $V_{DDH}$ power rail by an $n^-$-type contact region 18, wherein the p-wells 11 and 21 are electrically connected to the $V_{SS}$ power rail by $p^+$-type contact regions 19 and 29, respectively.

However, in a CMOS circuit with multiple power supplies, those power supplies may reach their full levels at different times after the IC chip is powered on. In a non-desirable power-on sequence, the power supply $V_{DDL}$ is established at the $V_{DDL}$ power rail sooner than the power supply $V_{DDH}$ at the $V_{DDH}$ power rail. Thus, as shown in FIG. 2, a time interval T exists in which the potential of the $V_{DDL}$ power rail is temporarily greater than that of the $V_{DDH}$ power rail. Under these circumstances, the junction between the $p^+$-type diffusion region 22 and the n-type well 20 is momentarily forward biased. Therefore, large current is conducted to flow through the n-type well 20 toward the $n^+$-type contact region 28 so that a lateral semiconductor controlled rectifier, comprises the $p^+$-type source diffusion region 22, the n-type well 20, the p-well 21, and the $n^+$-type source diffusion region 25, may be triggered to latch-up.

To prevent this, the conventional approach employs a guard ring around the CMOS circuit to collect additional carriers and thus suppress latch-up. However, as there a number of the CMOS circuits biased with multiple power supplies to be integrated in the IC chip, the fact that each CMOS circuit should be enclosed by the associated guard ring takes up a great amount of precious chip area.

SUMMARY OF THE INVENTION

Therefore, it is an object of the present invention to provide a latch-up protection circuit for integrated circuits biased with multiple power supplies to avoid latch-up damage during a non-desirable power-on sequence.

For achieving the aforementioned object, the present invention provides a latch-up protection circuit for an integrated circuit powered through a first power rail and a second power rail, the integrated circuit having at least one semiconductor bulk of a conductivity type. The latch-up protection circuit comprises a control circuit and a switch circuit. The control circuit is connected to the first power rail and the second power rail for detecting a relative voltage therebetween and generating a first control signal and a second control signal. The switch circuit is connected to the first power rail and the control circuit. When the relative voltage is greater than a first predetermined value, the switch circuit in response to the first control signal electrically connects the first power rail with the at least one semiconductor bulk. When the relative voltage is smaller than the first predetermined value, the switch in response to the first control signal electrically disconnects the first power rail from the at least one semiconductor bulk.

Accordingly, the latch-up protection circuit of the present invention can ensure that no forward-bias path exists between the n-well at the low-voltage CMOS circuit and the $p^{30}$-type source diffusion region during any power-on sequence, thus protecting the CMOS integrated circuit from latch-up.

BRIEF DESCRIPTION OF DRAWINGS

The following detailed description, given by way of examples and not intended to limit the invention to the embodiments described herein, will best be-understood in conjunction with the accompanying drawings, in which:

as shown in FIG. 3;

as shown in FIG. 3;

DETAILED DESCRIPTION OF THE INVENTION

Figure 1:
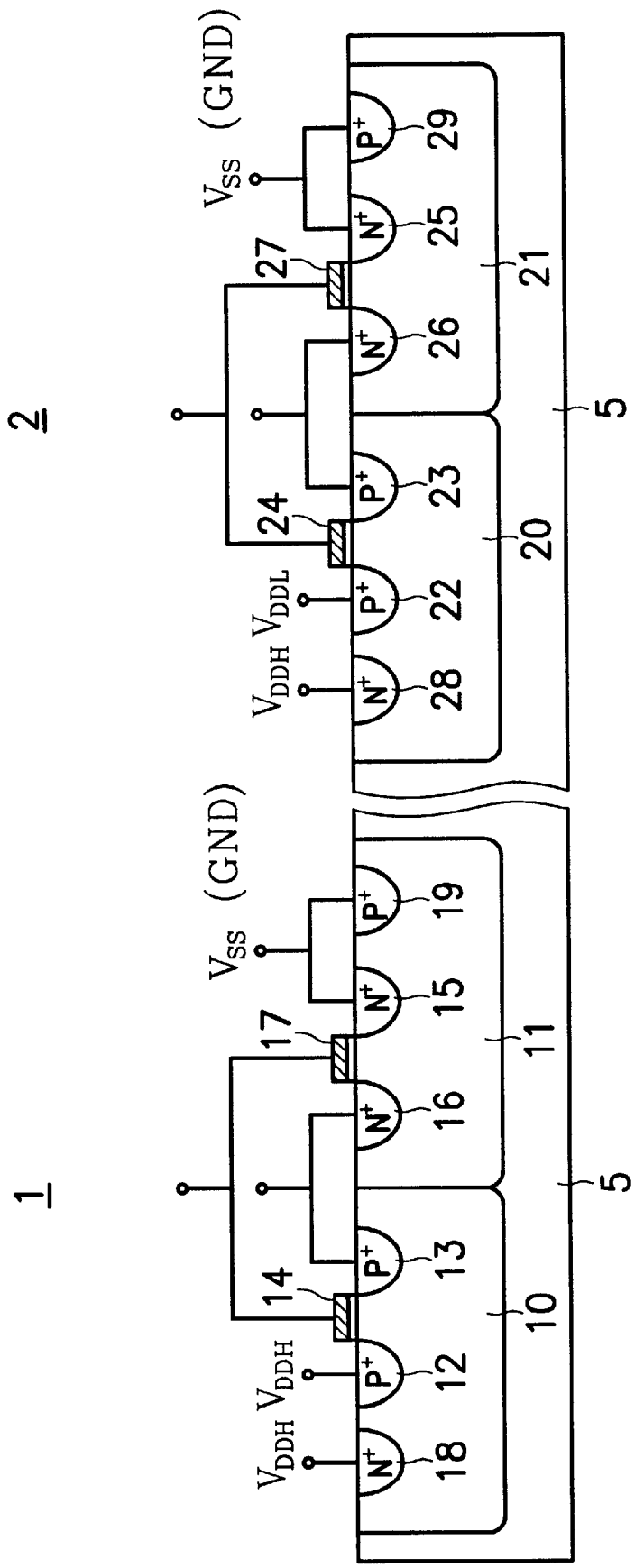
FIG. 1 schematically illustrates a conventional CMOS circuit of an IC chip with multiple power supplies in a cross-sectional view.
Figure 2:
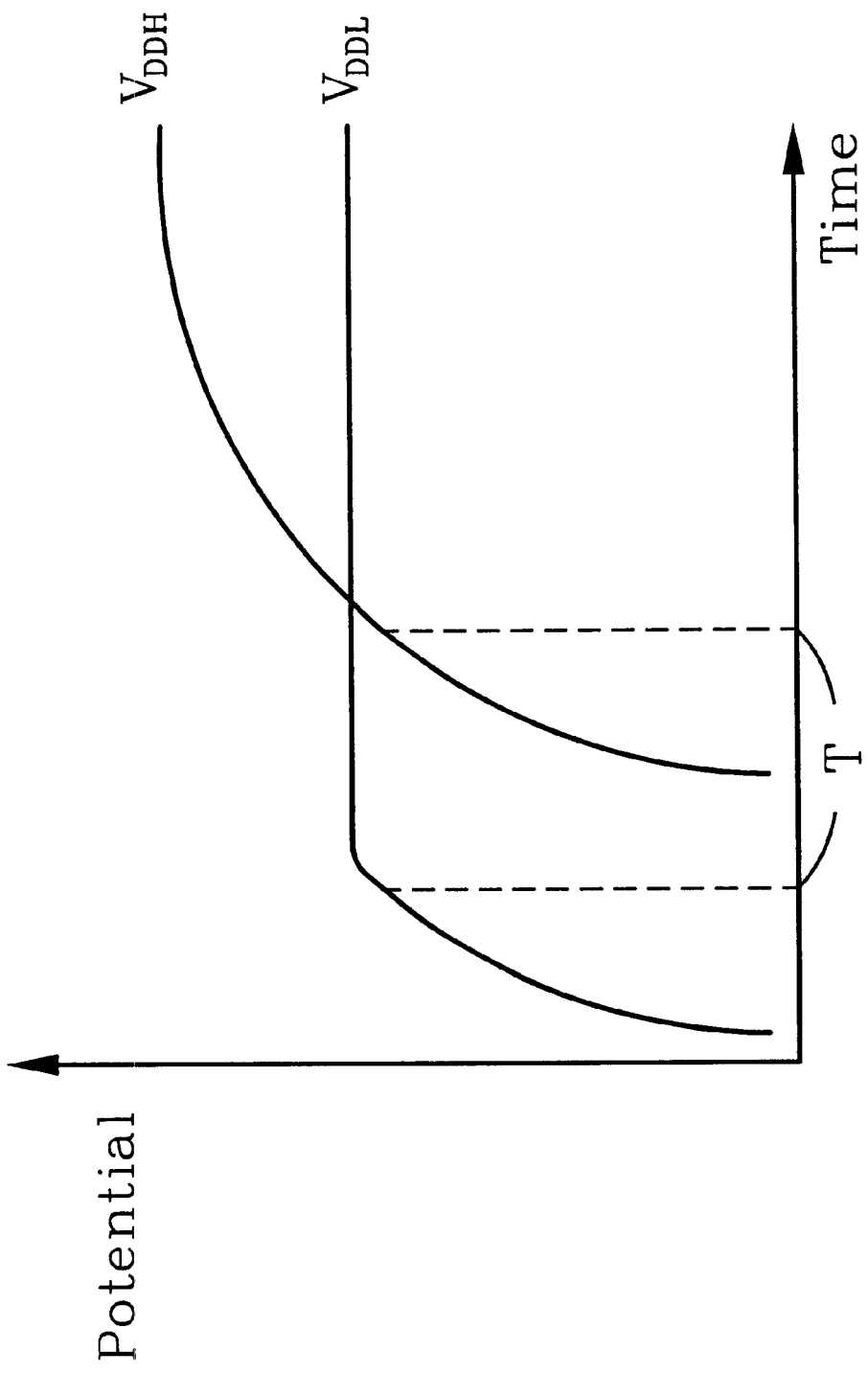
FIG. 2 a diagram illustrating that the power supply $V_{DDL}$ is established at a $V_{DDL}$ power rail sooner than the power supply $V_{DDH}$ at a $V_{DDH}$ power rail in a non-desirable power-on sequence.
Figure 3:
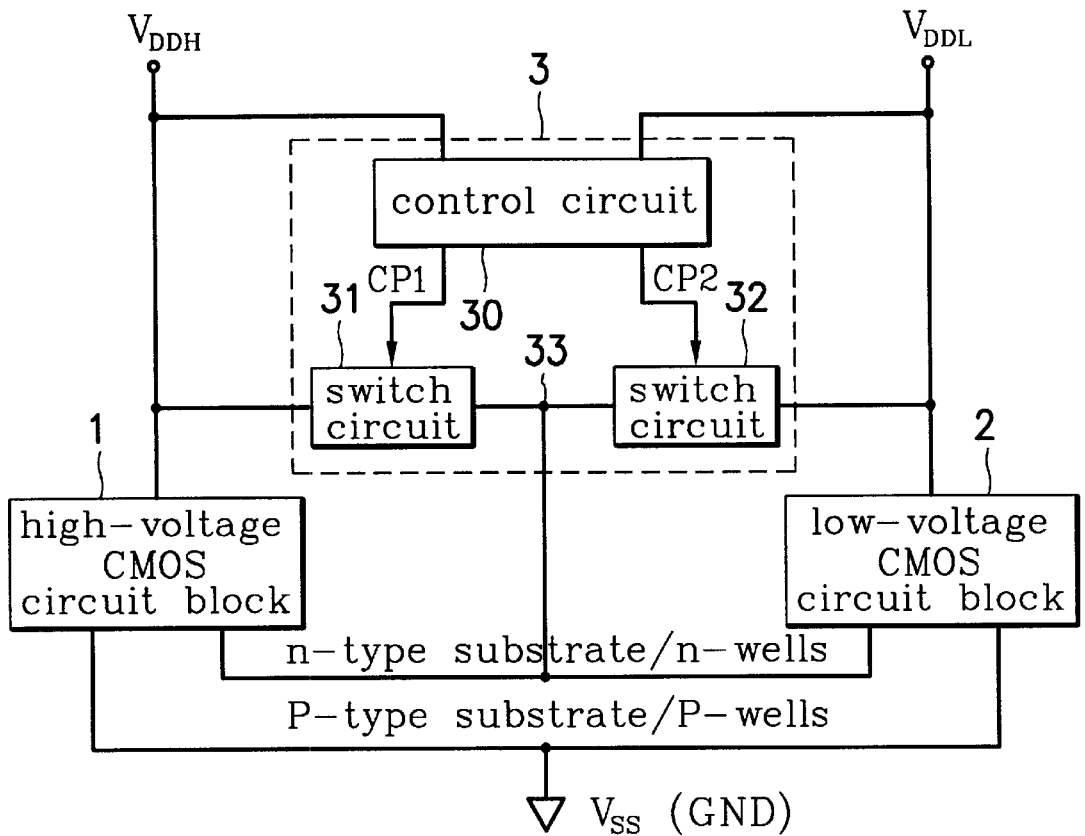
FIG. 3 schematically illustrates a block diagram of a latch-up protection circuit applied to an integrated circuit biased with multiple power supplies in accordance with the present invention.

Referring to FIG. 3, a block diagram of a latch-up protection circuit applied to an integrated circuit biased with multiple power supplies in accordance with the present invention is schematically illustrated. According to the present invention, the latch-up protection circuit 3 comprises a control circuit 30 and two switch circuits 31 and 32. The control circuit 30 is connected with the $V_{DDL}$ power rail and the $V_{DDH}$ power rail to detect them and thus generate two control signals CP1 and CP2 during a power-on sequence. The control signals CP1 and CP2 are employed to control the switch circuits 31 and 32, respectively.

In a non-desirable power-on sequence, the power supply $V_{DDL}$ may be established at the $V_{DDL}$ power rail sooner than the power supply $V_{DDH}$ at the $V_{DDH}$ power rail. According to the present invention, the control circuit 30 compares the potentials at the $V_{DDL}$ and $V_{DDH}$ power rails so as to generate the control signal CP1 for turning off the switch circuit 31. In other words, the switch circuit 31 disconnects the coupling path between the $V_{DDH}$ power rail and the n-well/n-substrate. At this time, the second control signal CP2 is used to turn on the switch circuit 32 and thus the $V_{DDL}$ power rail can be electrically coupled to the n-well/n-substrate. When the potential of the $V_{DDH}$ power rail higher than that of the $V_{DDL}$ power rail, the control circuit 30 turns on the switch circuit 31 by the control signal CP1 and turns off the switch circuit 32 by the control signal CP2. Thus, the $V_{DDH}$ power rail is electrically coupled to the n-well/n-substrate, but the $V_{DDL}$ power rail is blocked therefrom.

Accordingly, the latch-up protection circuit of the present invention can ensure that no forward-bias path exists between the n-well 20 at the low-voltage CMOS circuit 2 and the p$^+$-type source diffusion region 22 during any power-on sequence.

First Embodiment

Figure 4:
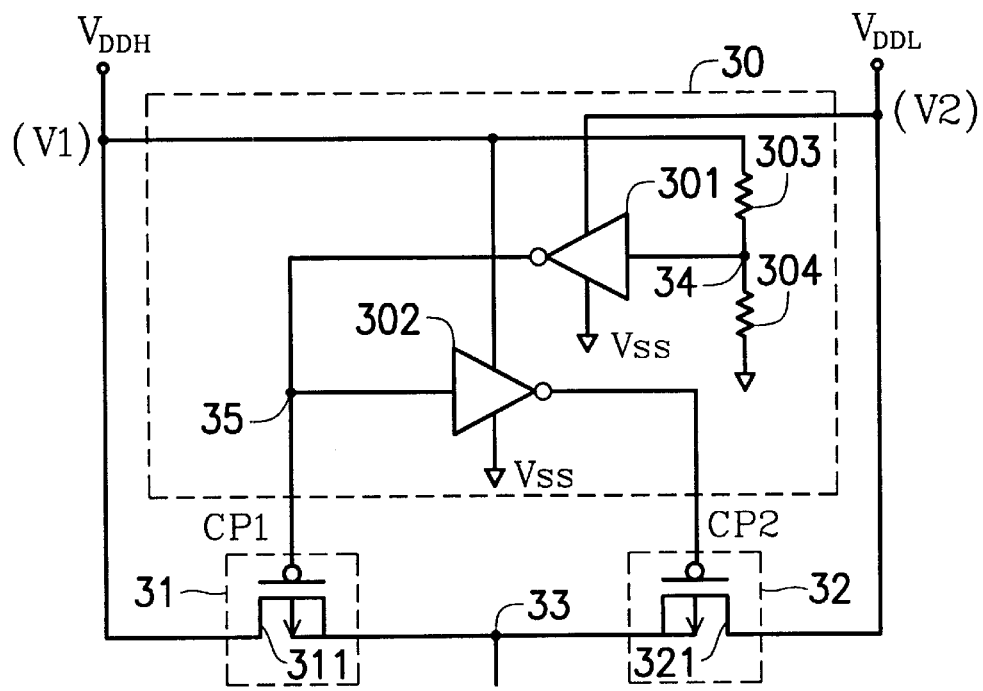
FIG. 4 schematically illustrates the circuit diagram of a first preferred embodiment of the latch-up protection circuit.

Referring to FIG. 4, the circuit diagram of a first preferred embodiment of the latch-up protection circuit as shown in FIG. 3 is schematically illustrated. In FIG. 4, the latch-up protection circuit comprises two inverters 301 and 302, and two resistors 303 and 304. The inverter 301 is powered through the $V_{DDL}$ power rail and the $V_{SS}$ power rail, and the inverter 302 is powered through the $V_{DDH}$ power rail and the $V_{SS}$ power rail. The resistors 303 and 304 are connected in series from the $V_{DDH}$ power rail to the $V_{SS}$ power rail to have a circuit node 34 therebetween. The inverter 301 is provided with its input terminal connected to the circuit node 34 and its output terminal connected to the input terminal of the inverter 302 to be a circuit node 35. The outputs of the inverters 301 and 302 generate the control signals CP1 and CP2, respectively.

Figure 11:
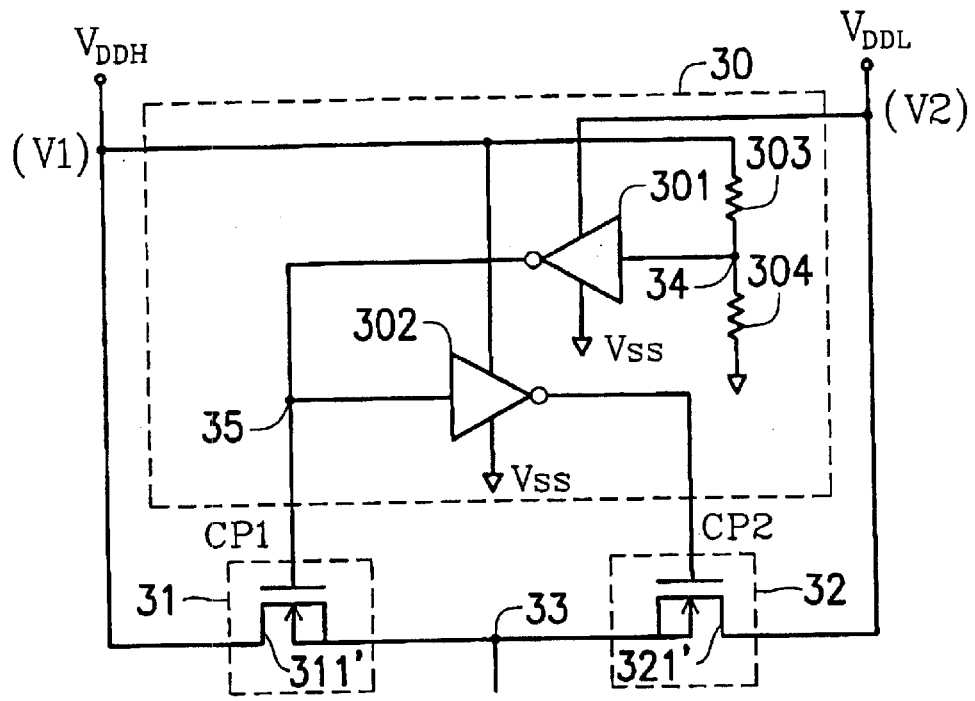
FIGS. 11 schematically illustrates the circuit diagram of another preferred embodiment of the latch-up protection circuit as shown in FIG. 4.

As shown in FIG. 4, the switch circuits 31 and 32 are constituted by pMOS transistors 311 and 321, respectively. The pMOS transistors 311 is configured with its gate for receiving the control signal CP1, its drain connected to the $V_{DDH}$ power rail, and both source and bulk connected to a circuit node 33. In addition, the pMOS transistors 321 is configured with its gate for receiving the control signal CP2, its drain connected to the $V_{DDL}$ power rail, and both source and bulk connected to a circuit node 33. Alternatively, the switch circuits 31 and 32 are constituted by nMOS transistors 311' and 321', as shown in FIG. 11. The nMOS transistors 311' is configured with its gate for receiving the control signal CP1, its drain connected to the $V_{DDH}$ power rail, and both source and bulk connected to a circuit node 33. In addition, the nMOS transistors 321' is configured with its gate for receiving the control signal CP2, its drain connected to the $V_{DDL}$ power rail, and both source and bulk connected to a circuit node 33.

Usually, the resistance difference between the resistors 303 and 304 are within the range of 30%. By taking the same resistance as an example, assuming the potentials at the $V_{DDH}$ power rail and the $V_{DDL}$ power rail are designated as V1 and V2, the inverter 301 due to be powered through the $V_{DDL}$ power rail has an inversion voltage 0.5V2, where the inverter 302 due to be powered through the $V_{DDH}$ power rail has an inversion voltage 0.5V1.

If V1<V2 occurs during the power-on sequence, the potential of the circuit node 34 is about 0.5V1 lower than the inversion voltage 0.5V2 of the inverter 301 and thus the circuit node 35 is charged to V2, that is, the potential at the control signal CP1 greater than the potential V1 at the $V_{DDH}$ power rail, so that the pMOS transistor 311 is turned off. Meanwhile, the circuit node 35 is charged to the potential V2 greater than the inversion voltage 0.5V1 of the inverter 302 to discharge the potential of the control signal CP2 near at the ground potential GND so that the pMOS transistor 321 is turned on to electrically couple the potential V2 at the $V_{DDL}$ power rail to the circuit node 33.

If V1>V2, the potential at the circuit node 34 is 0.5V1 greater than the inversion voltage 0.5V2 of the inverter 301 and thus the potential of the control signal CP1 approaches the ground potential GND to turn on the pMOS transistor 311 and the potential V1 at the $V_{DDH}$ power rail is electrically coupled to the circuit node 33. Meanwhile, the control signal CP2 is charged to the potential V1 greater than the potential V2 at the $V_{DDL}$ power rail so as to turn off the pMOS transistor 321.

Therefore, there is no forward-bias path between the n-well 20 of the low-voltage CMOS circuit 2 and the p⁺-type source diffusion region 22 during any power-on sequence, thus protecting the CMOS integrated circuit from latch-up.

Second Embodiment

Figure 5:
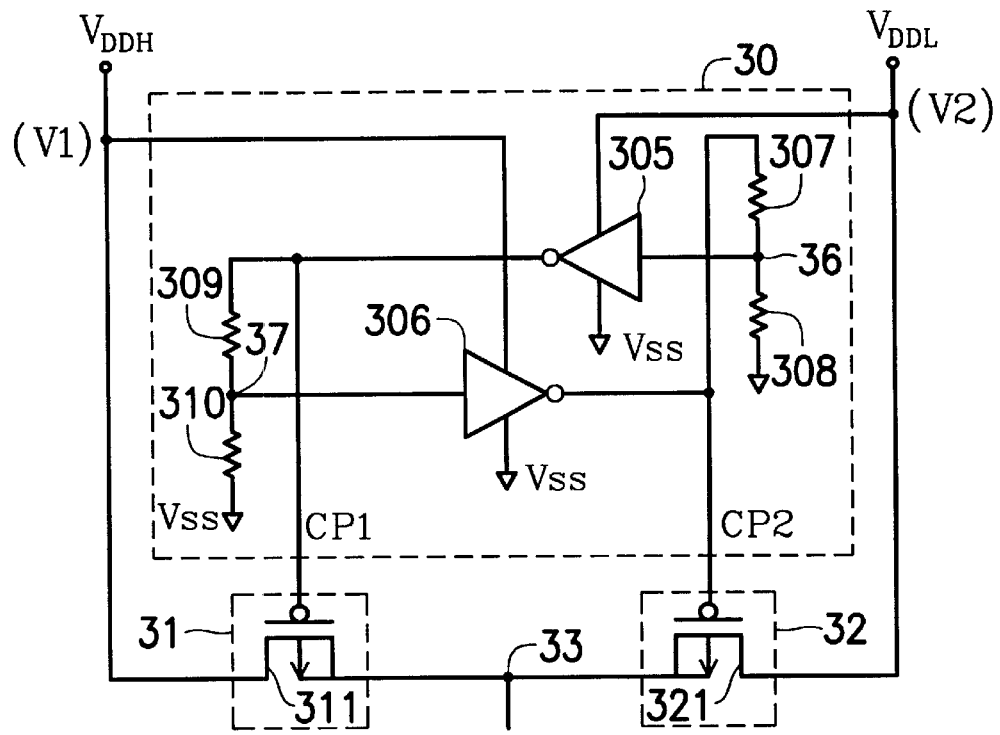
FIG. 5 schematically illustrates the: circuit diagram of a second preferred embodiment of the latch-up protection circuit as shown in FIG. 3.

Referring to FIG. 5, the circuit diagram of a second preferred embodiment of the latch-up protection circuit as shown in FIG. 3 is schematically illustrated. In FIG. 5, the control circuit 30 comprises two inverters 305 and 306, and four resistors 307–310. The inverter 305 is powered through the $V_{DDL}$ power rail and the $V_{SS}$ power rail, and the inverter 306 is powered through the $V_{DDH}$ power rail and the $V_{SS}$ power rail. The resistors 307 and 308 are connected in series from the output terminal of the inverter 306 to the $V_{SS}$ power rail to have a circuit node 36 therebetween. The inverter 305 is provided with its input terminal connected to the circuit node 36. The resistors 309 and 310 are connected in series from an output terminal of the inverter 305 to the $V_{SS}$ power rail to have a circuit node 37 therebetween. The inverter 306 is provided with its input terminal connected to the circuit node 37. The outputs of the inverters 305 and 306 generate the control signals CP1 and CP2, respectively.

As shown in FIG. 5, the switch circuits 31 and 32 are constituted by pMOS transistors 311 and 321, respectively. The pMOS transistors 311 is configured with its gate for receiving the control signal CP1, its drain connected to the $V_{DDH}$ power rail, and both source and bulk connected to a circuit node 33. In addition, the pMOS transistors 321 is configured with its gate for receiving the control signal CP2, its drain connected to the $V_{DDL}$ power rail, and both source and bulk connected to a circuit node 33

Usually, the resistance difference between the resistors 307 and 308 or between the resistors 309 and 310 are within the range of 30%. By taking the same resistance as an example, assuming the potentials at the $V_{DDH}$ power rail and the $V_{DDL}$ power rail are designated as V1 and V2, the inverter 305 due to be powered through the $V_{DDL}$ power rail has an inversion voltage 0.5V2, where the inverter 306 due to be powered through the $V_{DDH}$ power rail has an inversion voltage 0.5V1.

If V1<V2 occurs during the power-on sequence, the potential of the circuit node 36 is about 0~0.5V1 lower than the inversion voltage 0.5V2 of the inverter 305 and thus the output terminal of the inverter 305 is charged to V2, that is, the potential at the control signal CP1 greater than the potential V1 at the $V_{DDH}$ power rail, so that the pMOS transistor 311 is turned off. Meanwhile, the circuit node 37 is charged to the potential 0.5V2 greater than the inversion voltage 0.5V1 of the inverter 306 to discharge the control signal CP2 near to the ground potential GND so that the pMOS transistor 321 is turned on to electrically couple the potential V2 at the $V_{DDL}$ power rail to the circuit node 33. If V1>V2, the potential at the circuit node 36 is about 0~0.5V1 greater than the inversion voltage 0.5V2 of the inverter 305 and thus the potential of the control signal CP1 approaches the ground potential GND to turn on the pMOS transistor 311 and the potential V1 at the $V_{DDH}$ power rail is electrically coupled to the circuit node 33. Meanwhile, the control signal CP2 is charged to the potential V1 greater than the potential V2 at the $V_{DDL}$ power rail so as to turn off the pMOS transistor 321.

Therefore, there is no forward-bias path between the n-well 20 of the low-voltage CMOS circuit 2 and the p⁺-type source diffusion region 22 during any power-on sequence, thus protecting the CMOS integrated circuit from latch-up.

Moreover, the resistor 310 can be electrically connected to the $V_{SS}$ power rail by a power-on reset circuitry to be turned off after the power is turned on for a period of time and thus further decrease power consumption of the integrated circuit.

Third Embodiment

Figure 6:
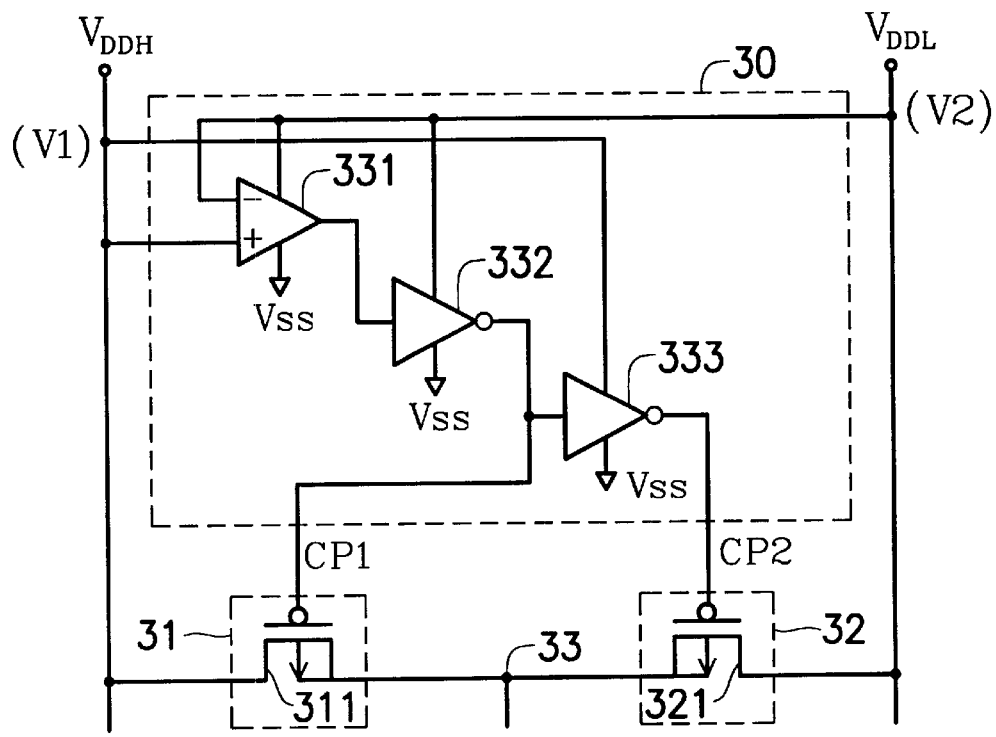
FIG. 6 schematically illustrates the circuit diagram of a third preferred embodiment of the latch-up protection circuit.

Referring to FIG. 6, the circuit diagram of a third preferred embodiment of the latch-up protection circuit as shown in FIG. 3 is schematically illustrated. The control circuit 30 comprises a differential amplifier 331 and two inverters 332 and 333. The differential amplifier 331 and the inverter 332 are powered through the $V_{DDL}$ power rail and the $V_{SS}$ power rail, and the inverter 333 is powered through the $V_{DDH}$ power rail and the $V_{SS}$ power rail. The differential amplifier 331 has its inverting input connected to the $V_{DDL}$ power rail and its non-inverting input connected to $V_{DDH}$ power rail. In addition, the differential amplifier 331 has its output connected to the input terminal of the inverter 332. The output terminal of the inverter 332 is connected to the input terminal of the inverter 333. Accordingly, the output terminal of the inverter 332 generates the control signal CP1 and the output terminal of the inverter 333 generates the control signal CP2.

As shown in FIG. 6, the switch circuits 31 and 32 are constituted by pMOS transistors 311 and 321, respectively. The pMOS transistors 311 is configured with its gate for receiving the control signal CP1, its drain connected to the $V_{DDH}$ power rail, and both source and bulk connected to a circuit node 33. In addition, the pMOS transistors 321 is configured with its gate for receiving the control signal CP2, its drain connected to the $V_{DDL}$ power rail, and both source and bulk connected to a circuit node 33

Assuming that the potentials at the $V_{DDH}$ power rail and the $V_{DDL}$ power rail are designated as V1 and V2, if V1<V2 occurs during the power-on sequence, the control signal CP1 is set to V1 to turn off the pMOS transistor 311. Meanwhile, the control signal CP2 is set to ground potential GND to turn on the pMOS transistor 321 so that the potential V2 at the $V_{DDL}$ power rail is electrically coupled to the circuit node 33. To the contrary, if V1>V2, the control signal CP1 is set to the ground potential GND to turn on the pMOS transistor 311 so that the potential V1 at the $V_{DDH}$ power rail is electrically coupled to the circuit node 33. However, the control signal CP2 is set to the potential V2 so as to turn off the pMOS transistor 321.

Fourth Embodiment

Figure 7:
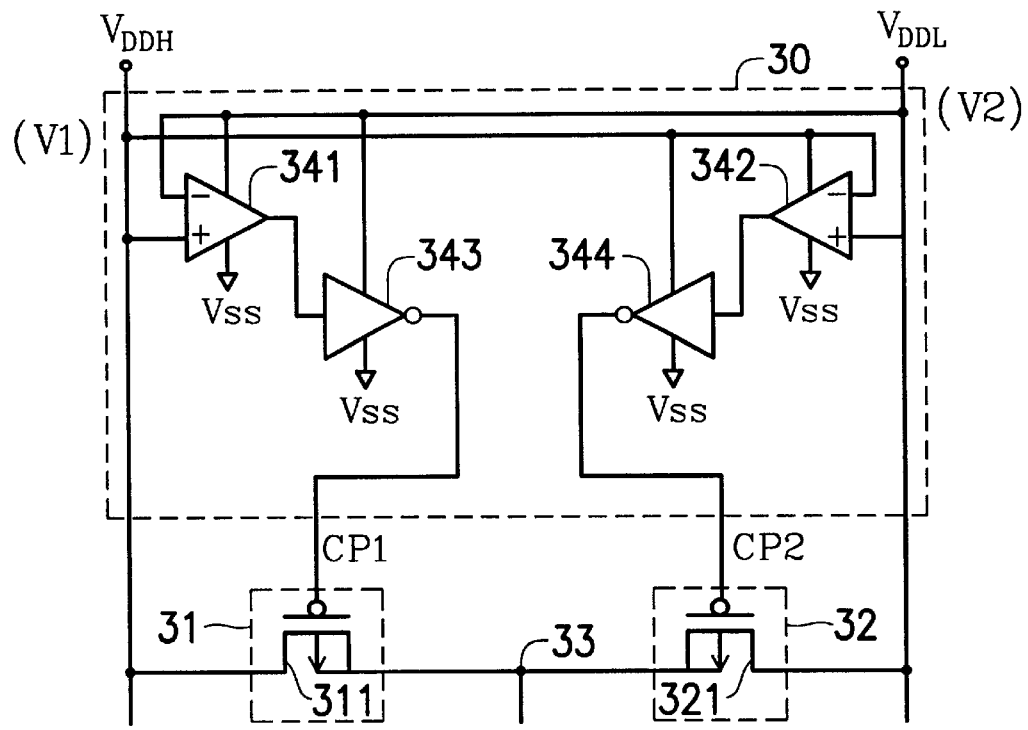
FIG. 7 schematically illustrates the circuit diagram of a fourth preferred embodiment of the latch-up protection circuit as shown in FIG. 3.

Referring to FIG. 7, the circuit diagram of a fourth preferred embodiment of the latch-up protection circuit as shown in FIG. 3 is schematically illustrated. In the drawing, the control circuit comprises two differential amplifiers 341 and 342, and two inverters 343 and 344. The differential amplifier 341 and the inverter 343 are powered through the $V_{DDL}$ power rail and the $V_{SS}$ power rail, and the differential amplifiers 342 and the inverter 344 are powered through the $V_{DDH}$ power rail and the $V_{SS}$ power rail. The differential amplifier 341 has its inverting input connected to $V_{DDL}$ power rail and its non-inverting input connected to $V_{DDH}$ power rail. The differential amplifier 341 has its output connected to the input terminal of the inverter 343. The differential amplifier 342 has its inverting input connected to $V_{DDH}$ power rail and its non-inverting input connected to $V_{DDL}$ power rail. The differential amplifier 342 has its output connected to the input terminal of the inverter 344. Accordingly, the output terminal of the inverter 343 generates the control signal CP1 and the output terminal of the inverter 344 generates the control signal CP2.

Figure 12:
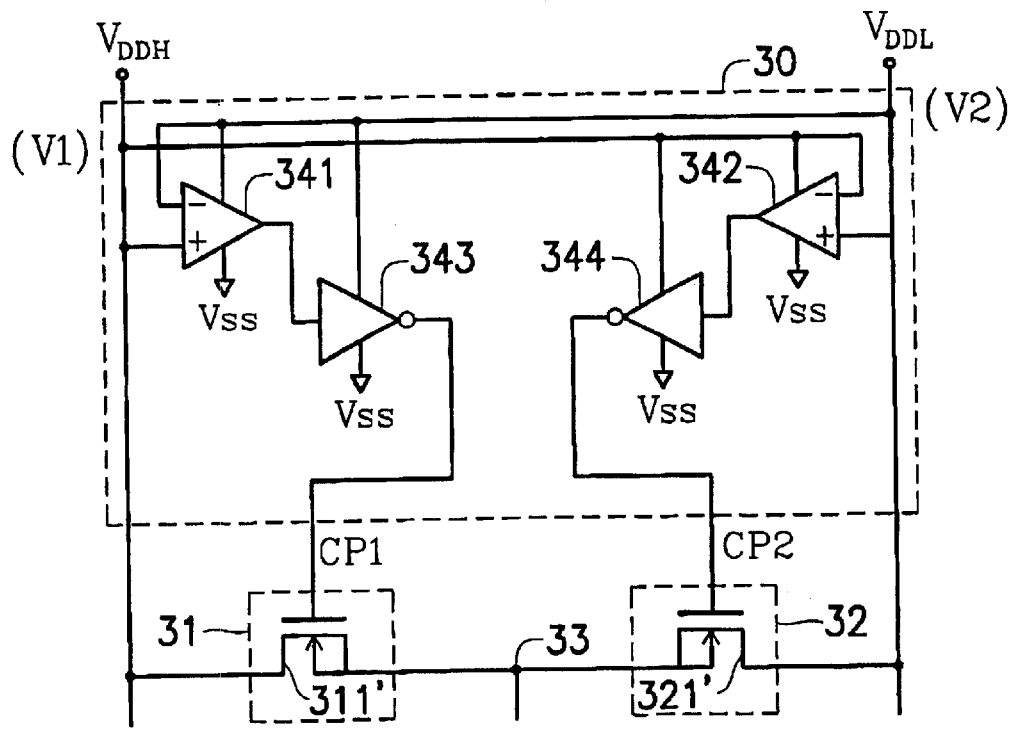
FIGS. 12 schematically illustrates the circuit diagram of another preferred embodiment of the latch-up protection circuit as shown in FIG. 7.

As shown in FIG. 7, the switch circuits 31 and 32 are constituted by pMOS transistors 311 and 321, respectively. The pMOS transistors 311 is configured with its gate for receiving the control signal CP1, its drain connected to the $V_{DDH}$ power rail, and both source and bulk connected to a circuit node 33. In addition, the pMOS transistors 321 is configured with its gate for receiving the control signal CP2, its drain connected to the $V_{DDL}$ power rail, and both source and bulk connected to a circuit node 33. Alternatively, the switch circuits 31 and 32 are constituted by nMOS transistors 311' and 321', as shown in FIG. 12. The nMOS transistors 311' is configured with its gate for receiving the control signal CP1, its drain connected to the $V_{DDH}$ power rail, and both source and bulk connected to a circuit node 33. In addition, the nMOS transistors 321' is configured with its gate for receiving the control signal CP2, its drain connected to the $V_{DDL}$ power rail, and both source and bulk connected to a circuit node 33.

Assuming that the potentials at the $V_{DDH}$ power rail and the $V_{DDL}$ power rail are designated as V1 and V2, if V1<V2 occurs during the power-on sequence, the control signal CP1 is set to V1 to turn off the pMOS transistor 311. Meanwhile, the control signal CP2 is set to ground potential GND to turn on the pMOS transistor 321 so that the potential V2 at the $V_{DDL}$ power rail is electrically coupled to the circuit node 33. To the contrary, if V1>V2, the control signal CP1 is set to the ground potential GND to turn on the pMOS transistor 311 so that the potential V1 at the $V_{DDH}$ power rail is electrically coupled to the circuit node 33. However, the control signal CP2 is set to the potential V2 so as to turn off the pMOS transistor 321.

Figure 8:
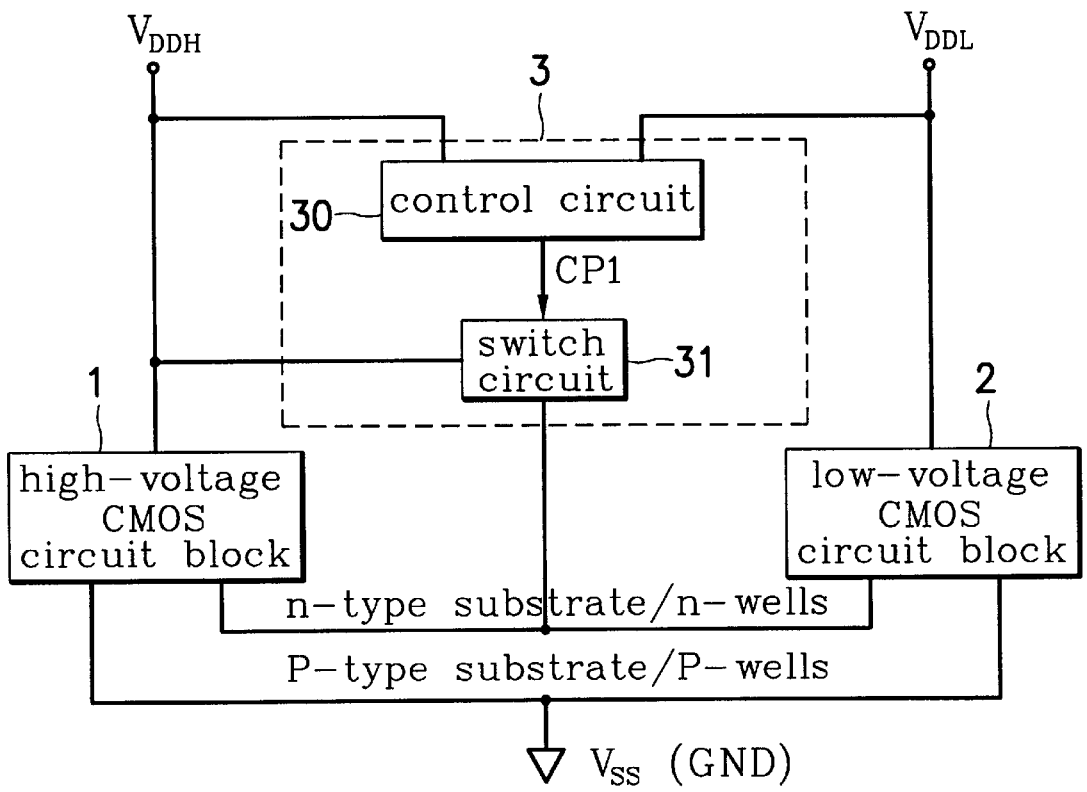
FIG. 8 schematically illustrates a block diagram of another latch-up protection circuit applied to an integrated circuit biased with multiple power supplies in accordance with the present invention.

Referring to FIG. 8, a block diagram of another latch-up protection circuit applied to an integrated circuit biased with multiple power supplies in accordance with the present invention is schematically illustrated. In this case, the switch circuit 32 is omitted so that there is no provision of the control signal CP2. In a non-desirable power-on sequence, the power supply $V_{DDL}$ may be established at the $V_{DDL}$ power rail sooner than the power supply $V_{DDH}$ at the $V_{DDH}$ power rail. The control circuit 30 of FIG. 8 compares the potentials at the $V_{DDL}$ and $V_{DDH}$ power rails so as to generate the control signal CP1 for turning off the switch circuit 31. In other words, the switch circuit 31 disconnects the coupling path between the $V_{DDH}$ power rail and the n-well/n-substrate. When the potential of the $V_{DDH}$ power rail is higher than that of the $V_{DDL}$ power rail, the control circuit 30 turns on the switch circuit 31 by the control signal CP1. Therefore, the $V_{DDH}$ power rail is electrically coupled to the n-well/n-substrate.

Also, the circuits of FIGS. 4~7 are suited for the control circuit 30 of FIG. 8.

Figure 9:
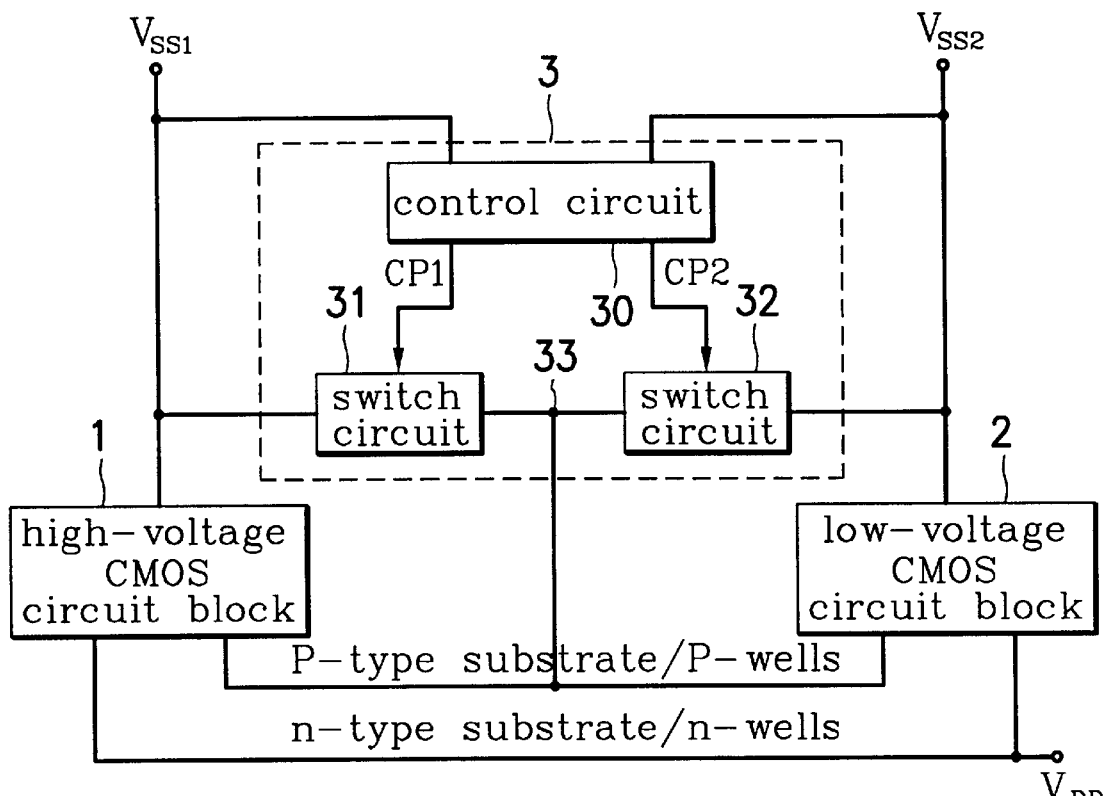
FIGS. 9 and 10 are associated with FIGS. 3 and 8, respectively, but applied for p-well/p-substrate processes.
Figure 10:
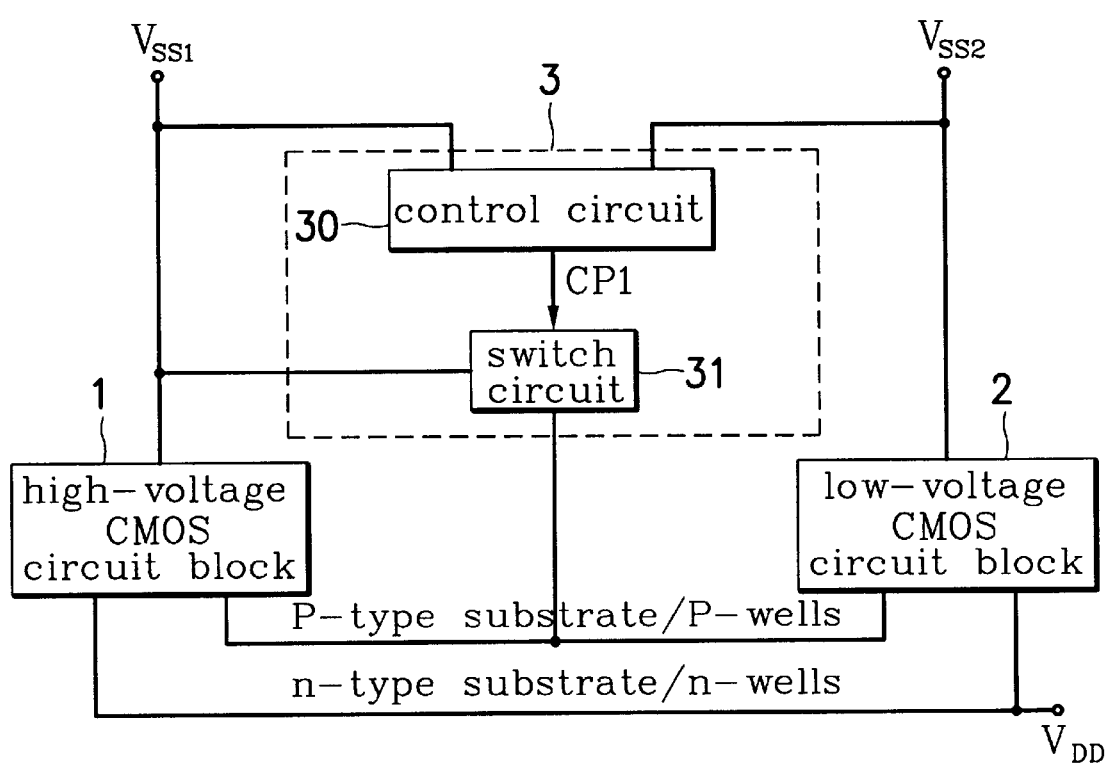

With respect to the circuitry biased with negative powers $V_{SS1}/V_{SS2}$', the latch-up protection circuit of the present invention can be also used to avoid latch-up damage. FIGS. 9 and 10 are associated with FIGS. 3 and 8, respectively. Assuming $|V_{SS1}|>|V_{SS2}|$, note that the circuit node 33 is connected with p-well/p-substrate. Furthermore, the switch circuits 31 and 32 of FIGS. 4~7 can be constituted by nMOS transistors when applied for the integrated circuits biased with $V_{SS1}/V_{SS2}$.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A latch-up protection circuit for an integrated circuit powered through a first power rail and a second power rail, said integrated circuit having at least one semiconductor bulk of a conductivity type; said latch-up protection circuit comprising:

a control circuit connected to said first power rail and said second power rail for detecting a relative voltage therebetween and generating a first control signal and a second control signal, the control circuit comprising a first inverter powered through said second power rail and provided with a first input terminal and a first output terminal providing said first control signal, and a second inverter powered through said first power rail and provided with a second input terminal and a second output terminal for providing said second control signal, wherein said first input terminal is coupled to said second output terminal;

a first switch circuit connected to said first power rail and said control circuit; wherein said first switch circuit in response to said first control signal electrically connects said first power rail with said at least one semiconductor bulk when said relative voltage is greater than a first predetermined value, and said first switch circuit in response to said first control signal electrically disconnects said first power rail from said at least one semiconductor bulk when said relative voltage is smaller than said first predetermined value;

and a second switch circuit connected to said second power rail and said control circuit, wherein said second switch circuit in response to said second control signal electrically disconnects said second power rail from said at least one semiconductor bulk when said relative voltage is greater than a second predetermined value, and said second switch circuit in response to said second control signal electrically connects said second power rail with said at least one semiconductor bulk when said relative voltage is smaller than said second predetermined value.

2. The latch-up protection circuit as claimed in claim 1 wherein said first predetermined value and said second predetermined value are substantially the same.

3. The latch-up protection circuit as claimed in claim 1, wherein the conductivity type of said at least one semiconductor bulk is n-type if said first power rail and said second power rail are positive power rails.

4. The latch-up protection circuit as claimed in claim 3, wherein said first switch circuit comprises a first pMOS transistor configured with a drain connected to said first power rail, a gate connected to said first control signal, and a source coupled to said at least one semiconductor bulk.

5. The latch-up protection circuit as claimed in claim 3, wherein said second switch circuit comprises a second pMOS transistor configured with a drain connected to said second power rail, a gate connected to said second control signal, and a source coupled to said at least one semiconductor bulk.

6. The latch-up protection circuit as claimed in claim 1, wherein the conductivity type of said at least one semiconductor bulk is p-type if said first power rail and said second power rail are negative power rails.

7. The latch-up protection circuit as claimed in claim 6, wherein said first switch circuit comprises a first nMOS transistor configured with a drain connected to said first power rail, a gate connected to said first control signal, and a source coupled to said at least one semiconductor balk.

8. The latch-up protection circuit as claimed in claim 6, wherein said second switch circuit comprises a second nMOS transistor configured with a drain connected to said second power rail, a gate connected to said second control signal, and a source coupled to said at least one semiconductor bulk.

9. The latch-up protection circuit a s claimed in claim 1, wherein said first input terminal is coupled to said second output terminal by a first voltage divider.

10. The latch-up protection circuit as claimed in claim 1, wherein said first input terminal is coupled to said second output by a first resistor and coupled to a third power rail by a second resistor.

11. The latch-up protection circuit as claimed in claim 10, wherein said third power rail is a $V_{SS}$ power rail.

12. The latch-up protection circuit as claimed in claimed in claim 10, wherein the resistance difference between said first resistor and said second resistor is within 30%.

13. The latch-up protection circuit as claimed in claim 10, wherein said second input terminal is coupled to said first output terminal by a third resistor and coupled to said third power rail by a fourth resistor.

14. The latch-up protection circuit as claimed in claim 13, wherein the resistance difference between said third resistor and said fourth resistor is within 30%.

15. The latch-up protection circuit as claimed in claim 1, wherein said second input terminal is coupled to said first output terminal by a second voltage divider.

16. The latch-up protection circuit as claimed in claim 1, wherein said second input terminal is connected to said first output terminal.

17. The latch-up protection circuit as claimed in claim 1, wherein said at least one semiconductor bulk is constituted by a plurality of wells connected together.

18. A latch-up protection circuit for an integrated circuit powered through a first power rail and a second power rail, said integrated circuit having at least one semiconductor bulk of a conductivity type; said latch-up protection circuit comprising:

a control circuit comprising a differential amplifier configured with a first input coupled to said second power rail, a second input coupled to said first power rail for detecting a relative voltage therebetween and an differential amplifier output, the control circuit generating a first control signal and a second control signal, the control circuit Her comprising a first inverter powered trough said second power rail and provided with a first input terminal coupled to the differential amplifier output and a first output terminal providing said first control signal, and a second inverter powered through said first power rail and provided with a second inverter input teal coupled to the first output terminal of the first inverter and a second output terminal for providing said second control signal;

a first switch circuit connected to said first power rail and said control circuit wherein said first switch circuit in response to said first control signal electrially connects said first power rail with said at least one semiconductor bulk when said relative voltage is greater than a fist predetermined value, and said first switch circuit in response to said first control signal electrically disconnects said first power rail from said at least one semiconductor bulk when said relative voltage is smaller than said first predetermined value;

and a second switch circuit connected to said second power rail and said control circuit, wherein said second switch circuit in response to said second control signal electrically disconnects said second power rail from said at least one semiconductor bulk when said relative voltage is greater than a second predetermined value, and said second switch circuit in response to said second control signal electrically connects said second power rail with said at least one semiconductor bulk when said relative voltage is smaller than said second predetermined value.

19. The latch-up protection circuit as claimed in claim 18, wherein said first input is an inverting input and said second input is a non-inverting input.

20. The latch-up protection circuit as claimed in claim 18, wherein said differential amplifier is powered through said second power rail.

21. A latch-up protection circuit for an integrated circuit powered through a first power rail and a second power rail, said integrated circuit having at least one semiconductor bulk of a conductivity type, said latch-up protection circuit comprising:

a control circuit connected to said first power rail and said second power rail for detecting a relative voltage therebetween and generating a first control signal and a second control signal, the control circuit comprising a first differential amplifier powered through said second power rail and configured with a first negative input coupled to said second power rail and a first positive input coupled to said first power rail, a second differential amplifier powered through said first power rail and configured with a second negative input coupled to said first power rail and a second positive input coupled to said second power rail;

a first switch circuit connected to said first power rail and said control circuit; wherein said first switch circuit in response to said fist control signal electrically connects said first power rail with said at least one semiconductor bulk when said relative voltage is greater than a first predetermined value, and said first switch circuit in response to said first control signal electrically disconnects said first power rail from said at least one semiconductor bulk when said relative voltage is smaller than said first predetermined value;

and a second switch circuit connected to said second power rail and said control circuit, wherein said second switch circuit in response to said second control signal electrically disconnects said second power rail from said at least one semiconductor bulk when said relative voltage is greater than a second predetermined value, and said second switch circuit in response to said second control signal electrically connects said second power rail with said at least one semiconductor bulk when said relative voltage is smaller than said second predetermined value.

22. The latch-up protection circuit as claimed in claim 21, wherein said control circuit further comprises a first inverter powered through said second power rail, said fist inverter having an input terminal coupled to an output of said first differential amplifier and an output terminal for providing said first control signal.

23. The latch-up protection circuit as claimed in claim 22, wherein said control circuit further comprises a second inverter powered through said first power rail, said second inverter having an input terminal coupled to an output of said second differential amplifier and an output terminal for providing said second control signal.

* * * * *